United States Patent
Yun et al.

(10) Patent No.: US 9,768,275 B2
(45) Date of Patent: Sep. 19, 2017

(54) ARRAY SUBSTRATE FOR FRINGE FIELD SWITCHING MODE LIQUID CRYSTAL DISPLAY DEVICE AND METHOD OF FABRICATING THE SAME

(71) Applicant: LG DISPLAY CO., LTD., Seoul (KR)

(72) Inventors: Yeong-Hyeok Yun, Paju-si (KR); Hyuck Choi, Paju-si (KR); Won-Doo Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 256 days.

(21) Appl. No.: 14/059,138

(22) Filed: Oct. 21, 2013

(65) Prior Publication Data

US 2014/0132875 A1 May 15, 2014

(30) Foreign Application Priority Data

Nov. 13, 2012 (KR) ........................ 10-2012-0127997

(51) Int. Cl.
*G02F 1/1343* (2006.01)
*H01L 29/66* (2006.01)
*G02F 1/1362* (2006.01)
*H01L 27/12* (2006.01)

(52) U.S. Cl.
CPC .. *H01L 29/66742* (2013.01); *G02F 1/136227* (2013.01); *G02F 1/136286* (2013.01); *H01L 27/124* (2013.01); *G02F 2001/136231* (2013.01)

(58) Field of Classification Search
CPC ......... G02F 1/134363; G02F 1/136227; G02F 1/136286; G02F 2001/136231; H01L 29/66742; H01L 27/124
USPC .......................................................... 349/141
See application file for complete search history.

(56) References Cited

U.S. PATENT DOCUMENTS

| | | | | |
|---|---|---|---|---|
| 6,542,138 B1 * | 4/2003 | Shannon | ............... | G09G 3/3233 315/169.3 |
| 2001/0048500 A1 * | 12/2001 | Lim | .................. | G02F 1/134363 349/141 |
| 2005/0094077 A1 * | 5/2005 | Baek | ................. | G02F 1/134363 349/141 |
| 2005/0094078 A1 * | 5/2005 | Kang | ................ | G02F 1/134363 349/141 |
| 2007/0103611 A1 * | 5/2007 | Park | .................. | G02F 1/134363 349/40 |

(Continued)

*Primary Examiner* — Charles Chang
(74) *Attorney, Agent, or Firm* — Seed Intellectual Property Law Group LLP

(57) ABSTRACT

An array substrate for a liquid crystal display (LCD) device includes a common line and gate lines. The array substrate includes a first, second, and third passivation layer and thin film transistors (TFTs). The second passivation layer includes first and second holes respectively corresponding to a drain electrode and the common line. A common electrode on the second passivation layer includes a first opening corresponding to the TFTs and a second opening in the second hole. A drain contact hole through the third and first passivation layers exposes the drain electrode. A first common contact hole through the third passivation layer exposes the common electrode in the second hole. A second common contact hole through the third and first passivation layers exposes the common line, and a pixel electrode includes a third opening and a connection pattern connecting the common electrode to the common line on the third passivation layer.

13 Claims, 12 Drawing Sheets

(56) References Cited

U.S. PATENT DOCUMENTS

2007/0121047 A1* 5/2007 Chung .................. G02F 1/1323
349/141
2011/0050551 A1* 3/2011 Ota .................... G02F 1/134363
345/87
2013/0020591 A1* 1/2013 Park ...................... G02F 1/1368
257/88

* cited by examiner

ARRAY SUBSTRATE FOR FRINGE FIELD SWITCHING MODE LIQUID CRYSTAL DISPLAY DEVICE AND METHOD OF FABRICATING THE SAME The present application claims the benefit of priority of Korean Patent Application No. 10-2012-0127997 filed in Korea on Nov. 13, 2012, which is hereby incorporated by reference for all purposes as if fully set forth herein.

FIELD OF THE INVENTION

The present disclosure relates to a liquid crystal display (LCD) device. The present disclosure also relates to an array substrate for a fringe field switching (FFS) mode LCD device having improved aperture ratio and being fabricated by a simple process and a method of fabricating the same.

DISCUSSION OF THE RELATED ART

A related art liquid crystal display (LCD) device uses optical anisotropy and polarization properties of liquid crystal molecules. The liquid crystal molecules have a definite alignment direction as a result of their thin and long shapes. The alignment direction of the liquid crystal molecules can be controlled by application of an electric field across the liquid crystal molecules. As the intensity or direction of the electric field is changed, the alignment of the liquid crystal molecules also changes. Since incident light is refracted based on the orientation of the liquid crystal molecules due to the optical anisotropy of the liquid crystal molecules, images can be displayed by controlling light transmissivity.

The related art LCD device includes an array substrate, a color filter substrate and a liquid crystal layer interposed therebetween. The array substrate may include a pixel electrode and a thin film transistor (TFT), and the color filter substrate may include a color filter layer and a common electrode. The related art LCD device is driven by an electric field between the pixel electrode and the common electrode resulting in excellent properties of transmittance and aperture ratio. However, since the related art LCD device uses a vertical electric field, the LCD device has a bad viewing angle.

An in-plane switching (IPS) mode LCD device may be used to resolve the above-mentioned limitations. In the IPS mode LCD device, the pixel electrode and the common electrode are formed on the same substrate and alternately arranged with each other such that a horizontal electric field is generated therebetween. Since the liquid crystal molecules are driven by the horizontal electric field, the IPS mode LCD device has an improved viewing angle.

Unfortunately, the IPS mode LCD device has disadvantages in aperture ratio and transmissivity. To resolve these limitations, an FFS mode LCD device, where the liquid crystal molecules are driven by a fringe field, is introduced.

FIG. 1 is a plane view showing one pixel region of an array substrate for the related art FFS mode LCD device. As shown in FIG. 1, on a substrate 1, a gate line 3 and a common line 7 are spaced apart from each other along one direction, and a data line 30 crosses the gate line 3 to define a pixel region P.

In addition, a thin film transistor (TFT) Tr acts as a switching element and is formed in each pixel region P. The TFT Tr is connected to the gate line 3 and the data line 30. The TFT Tr includes a gate electrode 5, gate insulating layer (not shown), a semiconductor layer (not shown), a source electrode 33 and a drain electrode 36.

First and second passivation layers (not shown), each of which includes a common contact hole 55 exposing the common line 7, are stacked on the TFT Tr and over an entire of the substrate 1. A common electrode 60 is formed on the second passivation layer and contacts the common line 7 through the common contact hole 55.

A third passivation layer (not shown) including a drain contact hole 68 is formed on the common electrode 60. The drain electrode 36 of the TFT Tr is exposed through the drain contact hole 68. A pixel electrode 70 is formed on the third passivation layer and in each pixel region P. The pixel electrode 70 contacts the drain electrode 36 through the drain contact hole 68 and includes an opening "op", which has a bar shape, corresponding to the common electrode 60.

FIG. 2 is a cross-sectional view taken along the line II-II of FIG. 1, and FIG. 3 is a cross-sectional view taken along the line III-III of FIG. 1.

As shown in FIGS. 2 and 3, the gate line 3 (of FIG. 1), the gate electrode 5 and the common line 7 are formed on the substrate 1, and the gate insulating layer 10 is formed on the gate line 3, the gate electrode 5 and the common line 7.

The semiconductor layer 20 is formed on the gate insulating layer 10 and corresponds to the gate electrode 5. The source and drain electrodes 33 and 36 are formed on the semiconductor layer 20 and spaced apart from each other.

The data line 30 is formed on the gate insulating layer 10 and crosses the gate line 3 to define the pixel region P.

The first passivation layer 40, which is formed of an inorganic insulating material, is formed on the data line 30, the source electrode 33 and the drain electrode 36, and the second passivation layer 50, which is formed of an organic insulating material and has a flat top surface, is formed on the first passivation layer 40. The common contact hole 55 exposing the common electrode 7 is formed through the first and second passivation layers 40 and 50.

The common electrode 60, which is formed of a transparent conductive material, is formed on the second passivation layer 50 and contacts the common line 7 through the common contact hole 55.

The third passivation layer 65, which is formed of an inorganic insulating material, is formed on the common electrode 60. The drain contact hole 68 exposing the drain electrode 36 of the TFT Tr is formed through the third, second and first passivation layers 65, 50 and 40.

The pixel electrode 70, which is formed of a transparent conductive material, is formed on the third passivation layer 65 and in each pixel region P. The pixel electrode 70 contacts the drain electrode 36 through the drain contact hole 68 and includes the opening labeled as "op" in FIG. 3. In FIG. 3, the opening op is formed with a bar shape, corresponding to the common electrode 60.

The array substrate for the related art FFS mode LCD device is fabricated by seven mask processes. The fabricating process is explained with FIGS. 1 to 3.

First, the gate line 3, the gate electrode 5 and the common line 7 are formed on the substrate 1 by a first mask process. Next, the gate insulating layer 10 is formed on the gate line 3, the gate electrode 5 and the common line 7.

Next, the data line 30, the semiconductor layer 20, the source electrode 33 and the drain electrode 36 are formed on the gate insulating layer 10 by a second mask process. Since the data line 30 is formed with the semiconductor layer 20 by a single mask process, there is a semiconductor pattern 21 including first and second dummy patterns 21a and 21b under the data line 30 and on the gate insulating layer 10.

Next, the first and second passivation layers 40 and 50 are sequentially formed on the data line 30, the source electrode 33 and the drain electrode 36. Through a third mask process, the second passivation layer 50 is patterned to form first and second holes (not shown), which respectively expose the first passivation layer 40 and respectively correspond to the drain electrode 36 and the common line 7.

Next, through a fourth mask process, the first passivation layer 40 corresponding to the second hole is patterned to form the common contact hole 55, which exposes the common line 7.

Next, through a fifth mask process, the common electrode 60, which contacts the common line 7 through the common contact hole 55, is formed on the second passivation layer 50.

Next, the third passivation layer 65 is formed on the common electrode 60. The third passivation layer 65 corresponding to the first hole and the first passivation layer 40 are patterned to form the drain contact hole 68 through a sixth mask process, which exposes the drain electrode 36.

Next, the pixel electrode 70, which is positioned in each pixel region P, is formed on the third passivation layer 65 by a seventh mask process. The pixel electrode 70 contacts the drain electrode 36 through the drain contact hole 68 and includes the opening "op", which has a bar shape, corresponding to the common electrode 60.

By the above seven mask process, the array substrate for the related art FFS mode LCD device is obtained.

The above-described seven mask process may be used for fabricating the array substrate. However, since the mask process includes many steps, such as a depositing step, an exposing step, a developing step, an etching step, and so on, the mask process causes increase of production costs.

As explained above, the array substrate for the related art FFS mode LCD device requires the explained seven mask process, which may result in a disadvantage on production costs as the number of mask processes increase.

SUMMARY OF THE INVENTION

Accordingly, embodiments of the present invention are directed to an array substrate for an FFS mode LCD device and a method of fabricating the same that substantially obviate one or more of the problems due to limitations and disadvantages of the related art.

An object of the present invention is to provide an array substrate for an FFS mode LCD device having improved aperture ratio.

Another object of the present invention is to provide an array substrate for an FFS mode LCD device being capable of reducing mask processes.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, an array substrate for a fringe field switching mode liquid crystal display device includes a common line on a substrate including a display region; first gate lines and second gate lines at opposite sides the common line; a gate insulating layer on the first and second gate lines and the common line; first and second data lines on the gate insulating layer, the first and second data lines crossing one of the first gate lines and the common line to define a first pixel region and crossing one of the second gate lines and the common line to define a second pixel region; first and second thin film transistor (TFT) in each of the first and second pixel regions; a first passivation layer on the first and second data lines and the first and second TFTs; a second passivation layer on the first passivation layer and including first and second holes respectively corresponding to a drain electrode of the first and second TFTs and the common line; a common electrode on the second passivation layer and including a first opening corresponding to each of the first and second TFTs and a second opening in the second hole; a third passivation layer on the common electrode; a drain contact hole corresponding to the first hole and through the third and first passivation layers such that the drain electrode of the first and second TFTs is exposed through the drain contact hole; a first common contact hole corresponding to the second hole and through the third passivation layer such that the common electrode in the second hole is exposed through the first common contact hole; a second common contact hole corresponding to the second opening and through the third and first passivation layers and the gate insulating layer such that the common line is exposed through the second common contact hole; a pixel electrode on the third passivation layer and in each of the first and second pixel regions, the pixel electrode including at least one third opening and connected to respective drain electrode; and a connection pattern on the third passivation layer and connecting the common electrode to the common line.

In another aspect of the present invention, a method of fabricating an array substrate for a fringe field switching mode liquid crystal display device includes forming a common line at a center of a display region, which includes a plurality of pixel regions, first gate lines at one side of the common line, second gate lines at the other side of the common line, and a gate electrode connected to respective gate line; forming a gate insulating layer on the common line, the first and second gate lines and the gate electrode; forming a semiconductor layer on the gate line and corresponding to the gate electrode, first and second data lines, source and drain electrodes on the semiconductor layer and spaced apart from each other, the first and second data lines crossing one of the first gate line and the common line to define a first pixel region and crossing one of the second gate line and the common line to define a second pixel region; forming a first passivation layer on the first and second data lines and the source and drain electrodes; forming a second passivation layer on the first passivation layer and including first and second holes respectively corresponding to the drain electrode and the common line; forming a common electrode on the second passivation layer and including a first opening corresponding to the drain electrode and a second opening in the second hole; forming a third passivation layer on the common electrode; patterning the third passivation layer corresponding to the second hole to form a first common contact hole exposing the common electrode; patterning the third and first passivation layers corresponding to the first hole to form a drain contact hole exposing the drain electrode; patterning the third and first passivation layers and the gate insulating layer corresponding to the second opening to form a second common contact hole exposing the common line; and forming a pixel electrode and a connection pattern on the third passivation layer, the pixel electrode connected to the drain electrode through the drain electrode and including at least one opening, and the connection pattern connecting the common electrode to the common line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings. The same reference numbers may be used throughout the drawings to refer to the same or like parts.

As described above, the array substrate of the related art FFS mode LCD device is fabricated by the seven mask process with increased production costs. To reduce the cost of mask processes, the drain contact hole may be formed in the third mask process. However, as the drain electrode is exposed through the drain contact hole during the fourth and fifth mask processes, particles may be stacked on the drain electrode. In this case, a contact problem between the pixel electrode and the drain electrode can be generated.

In addition, when a problem occurs in the fifth mask process for forming the common electrode with the drain contact hole, an electrical short problem between the common electrode and the pixel and drain electrodes can be generated.

Accordingly, to avoid the above problems, the above seven mask process may be required. Moreover, since the common line is formed in each pixel region, the array substrate may have a bad or worse aperture ratio.

An array substrate for an FFS mode LCD device, which is fabricated with reduced mask processes without the above problems, is introduced.

Figure 1:
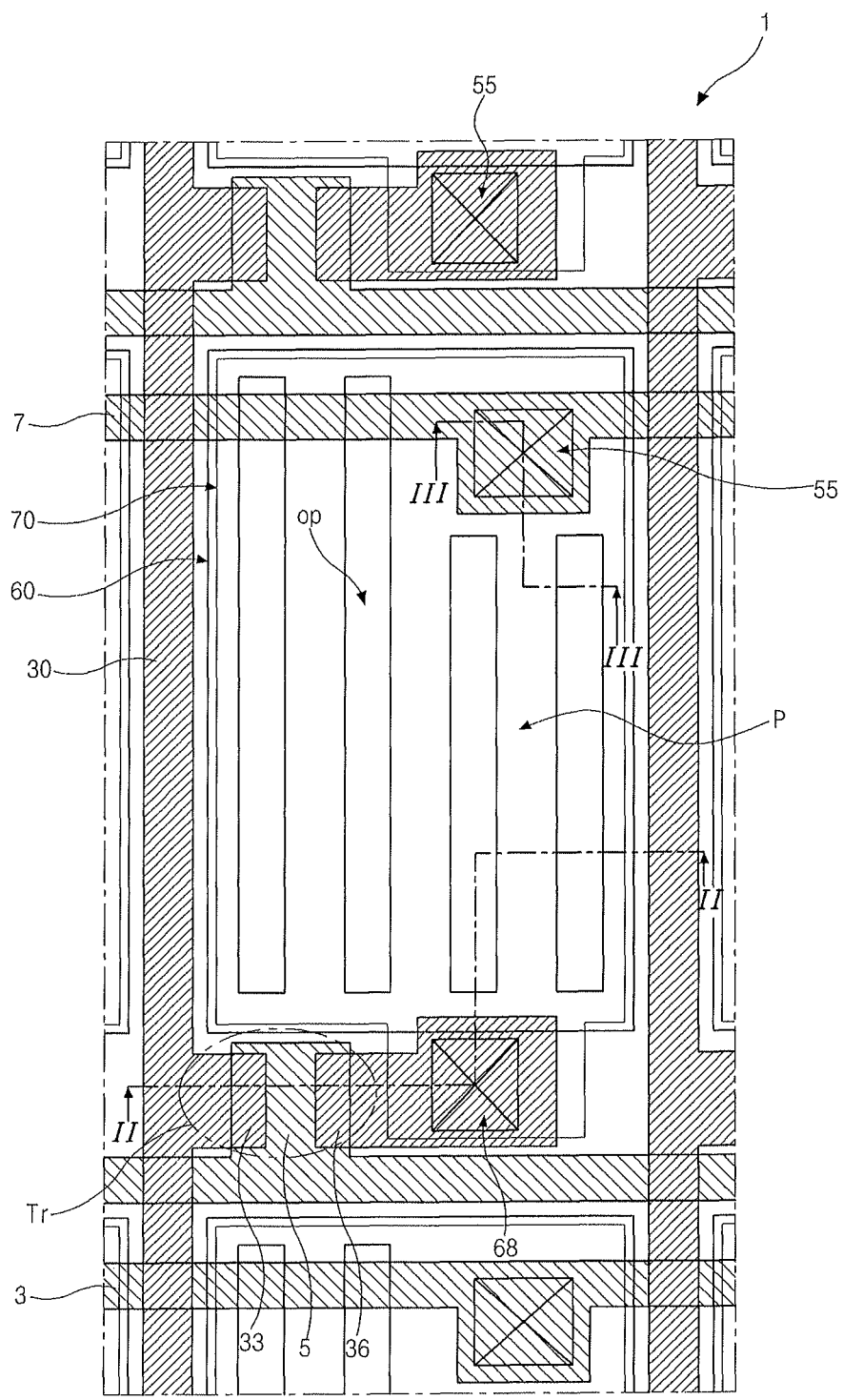
FIG. 1 is a plane view showing one pixel region of an array substrate for the related art FFS mode LCD device.
Figure 2:
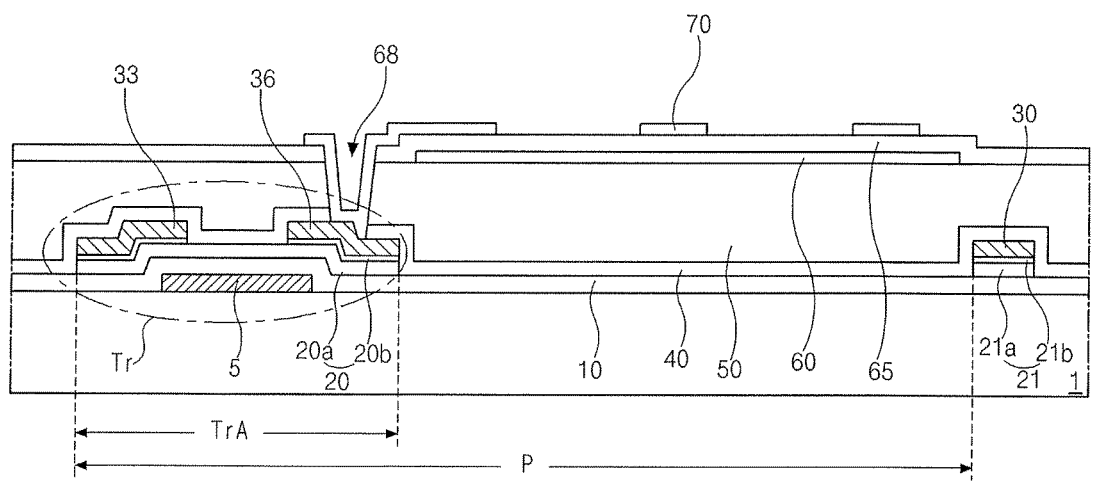
FIG. 2 is a cross-sectional view taken along the line II-II of FIG. 1.
Figure 3:
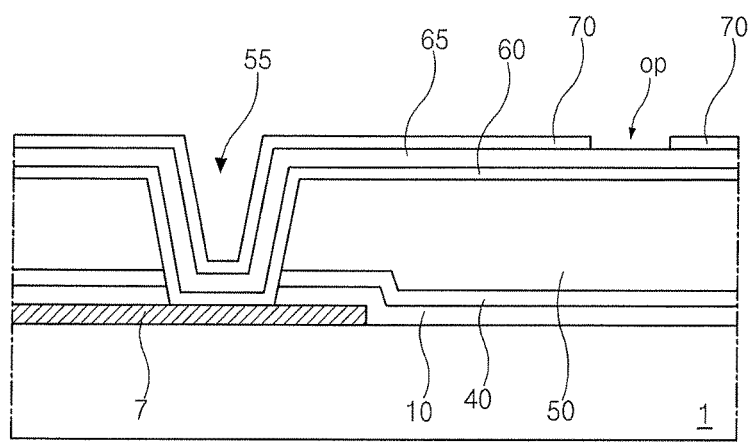
FIG. 3 is a cross-sectional view taken along the line III-III of FIG. 1.
Figure 4:
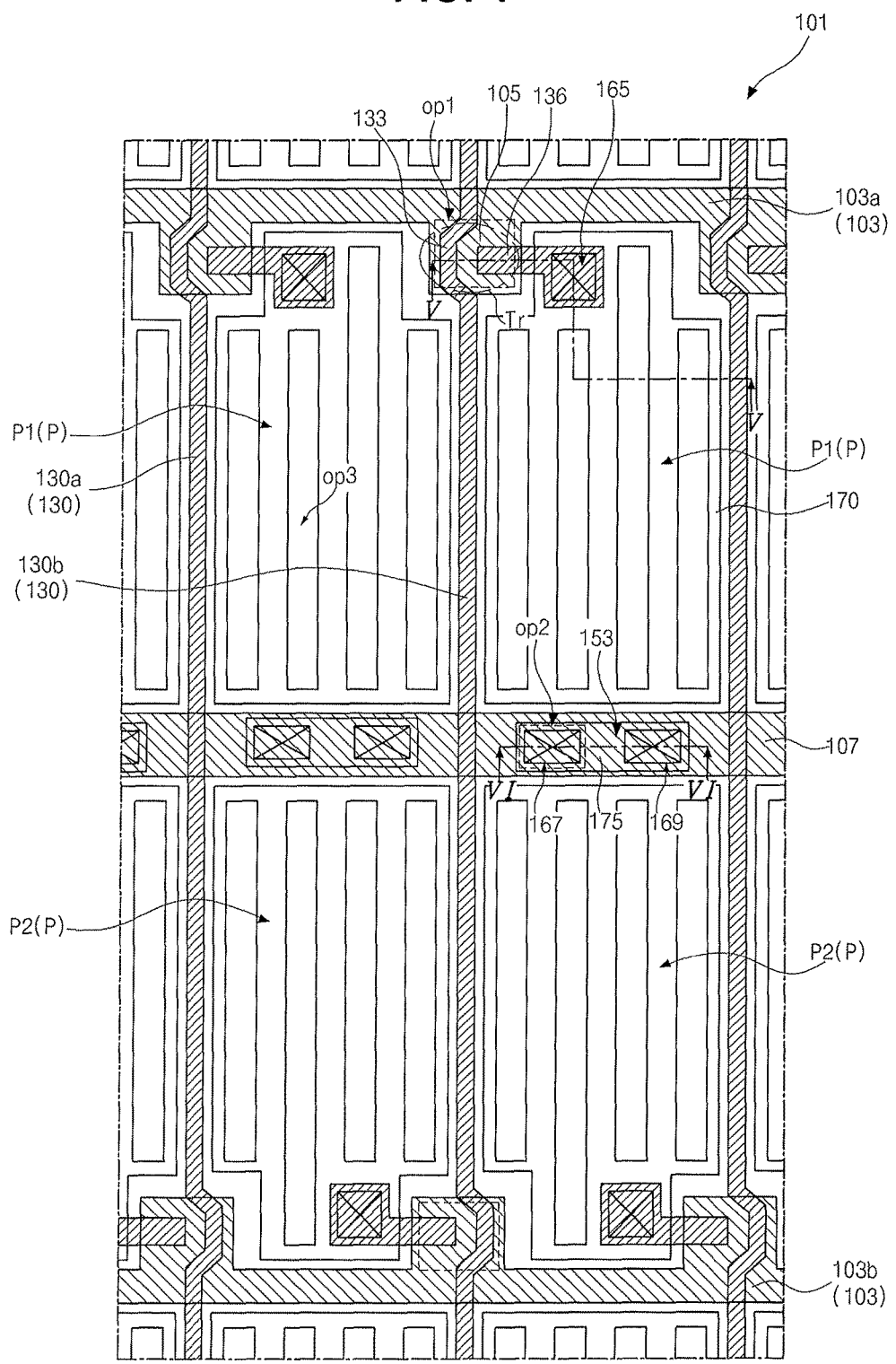
FIG. 4 is a plane view of four pixel region in a center of an array substrate for an FFS mode LCD device according to an embodiment of the present invention.
Figure 5:
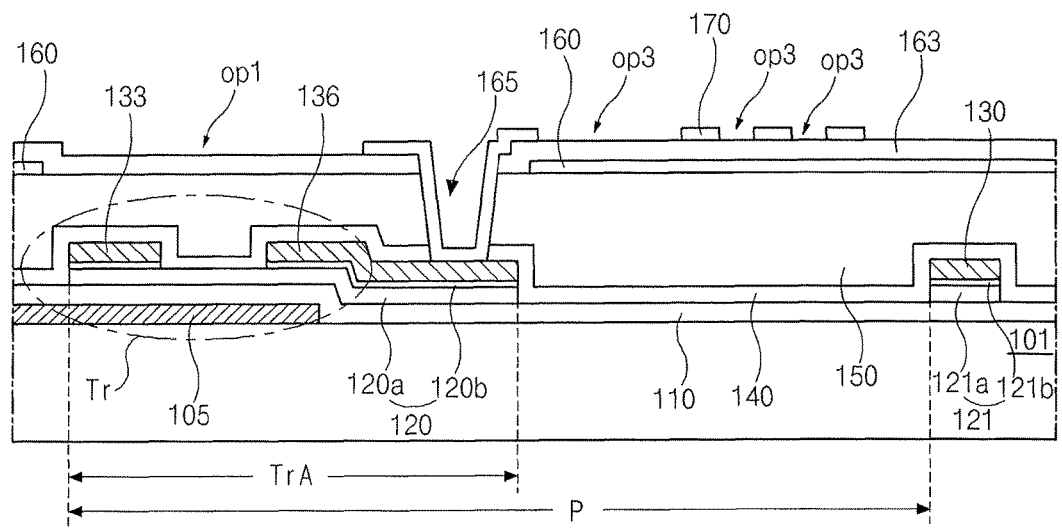
FIG. 5 is a cross-sectional view taken along the line V-V of FIG. 4.
Figure 6:
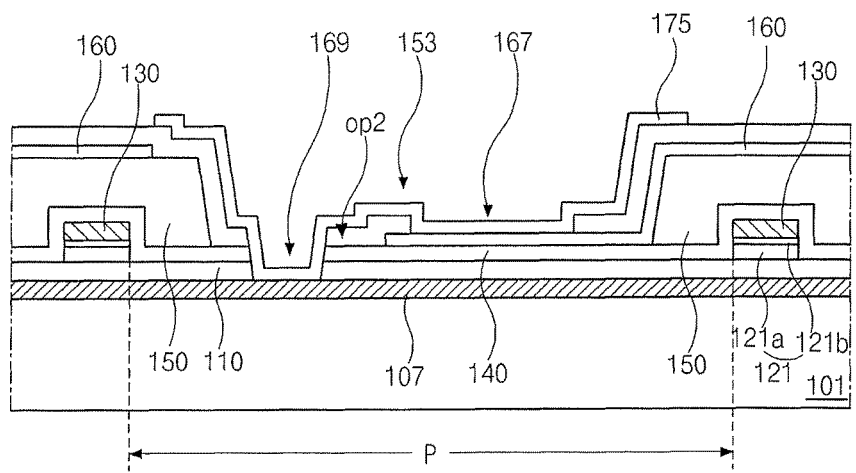
FIG. 6 is a cross-sectional view taken along the line VI-VI of FIG. 4.

FIG. 4 is a plane view of a four pixel region in a center of an array substrate for an FFS mode LCD device according to an embodiment of the present invention. FIG. 5 is a cross-sectional view taken along the line V-V of FIG. 4, and FIG. 6 is a cross-sectional view taken along the line VI-VI of FIG. 4. For the sake of explanation, a region, where a TFT Tr is formed, is defined as a switching region TrA in a pixel region P.

As shown in FIGS. 4 to 6, first and second gate lines 103a and 103b and a common line 107 along a first (e.g., horizontal) direction are formed on a substrate 101. In FIG. 4, the gate lines 103 at an upper side of the common line 107 are referred to as the first gate lines 103a, and the gate lines 103 at a lower side of the common line 107 are referred to as the second gate lines 103b.

The common line 107 is parallel to the first and second gate lines 103a and 103b and disposed between one of the first gate lines 103a and one of the second gate lines 103b. In other words, in one embodiment of the present invention, only one common line 107 is formed in an entire surface of a display region of the substrate 101. Accordingly, there are no additional or separate common lines 107 between adjacent first gate lines 103a and between adjacent second gate lines 103b. In addition, a gate electrode 105, which is connected to the gate line 103, is formed in the switching region TrA.

The first and second gate lines 103a and 103b, the gate electrode 105 and the common line 107 may be formed of a low resistance metallic material. For example, the first and second gate lines 103a and 103b, the gate electrode 105 and/or the common line 107 may be formed of at least one of aluminum (Al), Al alloy, copper (Cu), Cu alloy, molybdenum (Mo) and Mo alloy (MoTi), for example.

As mentioned above, the common line 107 is formed at a center of the display region, which includes a plurality of pixel regions P, of the array substrate. Namely, there is a single common line 107 in the entirety of the display region (e.g., a display region of an entire liquid crystal pane). The first and second gate lines 103a and 103b are spaced apart from the common line 107 by a length of a major axis of each pixel region P, for example.

A gate insulating layer 110 is formed on the gate lines 103, the gate electrode 105 and the common line 107. A data line 130 crossing the first and second gate lines 103a and 103b as well as the common line 107 is formed on the gate insulating layer 110. Namely, the data line 130 extends along a second (e.g., vertical) direction different from the first direction.

In the portion of the display region that includes the common line 107, a pixel region P may be defined by the gate lines 103, the data lines 130 and the common line 107. Meanwhile, in portions of the display region that do not include the common line 107, a pixel region P may be defined by (i) first gate lines 103a and the data lines 130 or (ii) second gate lines 103b and the data lines 130.

In more detail, a pixel region P1 in FIG. 4 is surrounded by the first gate line 103a, the common line 107 and first and second data lines 130a and 130b, thus defining the first pixel region P1. Also in FIG. 4, a pixel region P2 is surrounded by the second gate line 103a, the common line 107 and first and second data lines 130a and 130b, thus defining the second pixel region P2.

A semiconductor layer 120 is formed on the gate insulating layer 110 and in the switching region TrA. The semiconductor layer 120 corresponds to the gate electrode 105 and includes an active layer 120a of intrinsic amorphous silicon and an ohmic contact layer 120b of impurity-doped amorphous silicon, for example. A source electrode 133 and a drain electrode 136 may be formed on the semiconductor layer 120. The source and drain electrodes 133 and 136 are spaced apart from each other. The source electrode 133 may be connected to the data line 130. Since the data line 130 is formed with the semiconductor layer 120 by a single mask process, there can be semiconductor pattern 121 including first and second patterns 121*a* and 121*b* under the data line 130 and on the gate insulating layer 110.

The gate electrode 105, the gate insulating layer 110, the semiconductor layer 120, the source electrode 133 and the drain electrode 136 constitute the TFT Tr in the switching region TrA.

In FIGS. 4-6, the TFT Tr in the pixel regions P above the common line 107 are connected to the first gate line 103*a* and the first data line 130*a*, and the TFT in the pixel region P below the common line 107 are connected to the second gate line 103*b* and the second data line 130*b*. Alternatively, the TFT Tr in the pixel regions P above the common line 107 may be connected to the first gate line 103*a* and one of the first and second data lines 130*a* and 130*b*, and the TFT in the pixel region P below the common line 107 may be connected to the second gate line 103*b* and one of the first and second data lines 130*a* and 130*b*.

On the data lines 130 and the TFT Tr, a first passivation layer 140, which may be formed of an inorganic insulating material, and a second passivation layer 150, which may be formed of an organic insulating material, are stacked. The second passivation layer 150 may have a flat top surface. The inorganic insulating material may be silicon oxide or silicon nitride, and the organic insulating material may be photoacryl, for example.

In the second passivation layer 150, a first hole 153 corresponding to the common line 107 is formed. The first hole 153 may be formed in each pixel column. Alternatively, one first hole 153 may be formed in at least two adjacent pixel regions P along the gate line 103.

A common electrode 160, which is formed of a transparent conductive material, e.g., indium-tin-oxide (ITO) or indium-zinc-oxide (IZO), is formed on the second passivation layer 150. The common electrode 160 may cover an entire display region and has a first opening "op1" exposing the switching region TrA in each pixel region P. Particularly, the first opening "op1" exposes the drain contact hole 165 to avoid an electrical short with a pixel electrode 170. In addition, the common electrode 160 has a second opening "op2" corresponding to a part of the first hole 153. In other words, an end of the second opening "op2" is disposed in the first hole 153.

A third passivation layer 163, which is formed of an inorganic insulating material, e.g., silicon oxide or silicon nitride, is formed on the common electrode 160 including the first and second openings "op1" and "op2". The drain contact hole 165 exposing the drain electrode 136 of the TFT Tr is formed through the first to third passivation layers 140, 150 and 163. In addition, a first common contact hole 167 exposing the common electrode 160 in the first hole 153 is formed through the third passivation layer 163, and a second common contact hole 169 exposing the common line 107 in the second opening "op2" is formed through the gate insulating layer 110, and first and third passivation layer 140 and 163.

A pixel electrode 170, which is formed of a transparent conductive material, e.g., ITO or IZO, is formed on the third passivation layer 163 including the drain electrode 165, and the first and second common contact holes 167 and 169. The pixel electrode 170 is separately formed in each pixel region P and contacts the drain electrode 136 through the drain contact hole 165. The pixel electrode 170 has at least one third opening "op3" of a bar shape. The third opening "op3" corresponds to the common electrode 160.

In FIG. 4, the third opening "op3" has a straight bar shape. Alternatively, the third opening "op3" may have a bent shape with respect to a center line of the pixel region P. In addition, the third openings "op3" in vertically adjacent pixel regions P may together form a symmetrically bent shape with respect to the gate line 103 between the adjacent pixel regions P.

Figure 7:
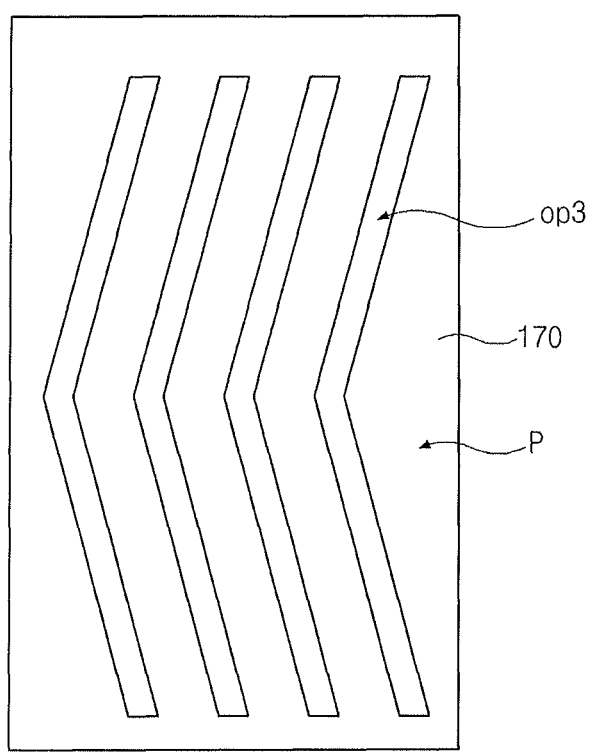
FIGS. 7, 8 and 9 are schematic views respectively showing modifications of an opening of a pixel electrode according to embodiments of the present invention.
Figure 8:
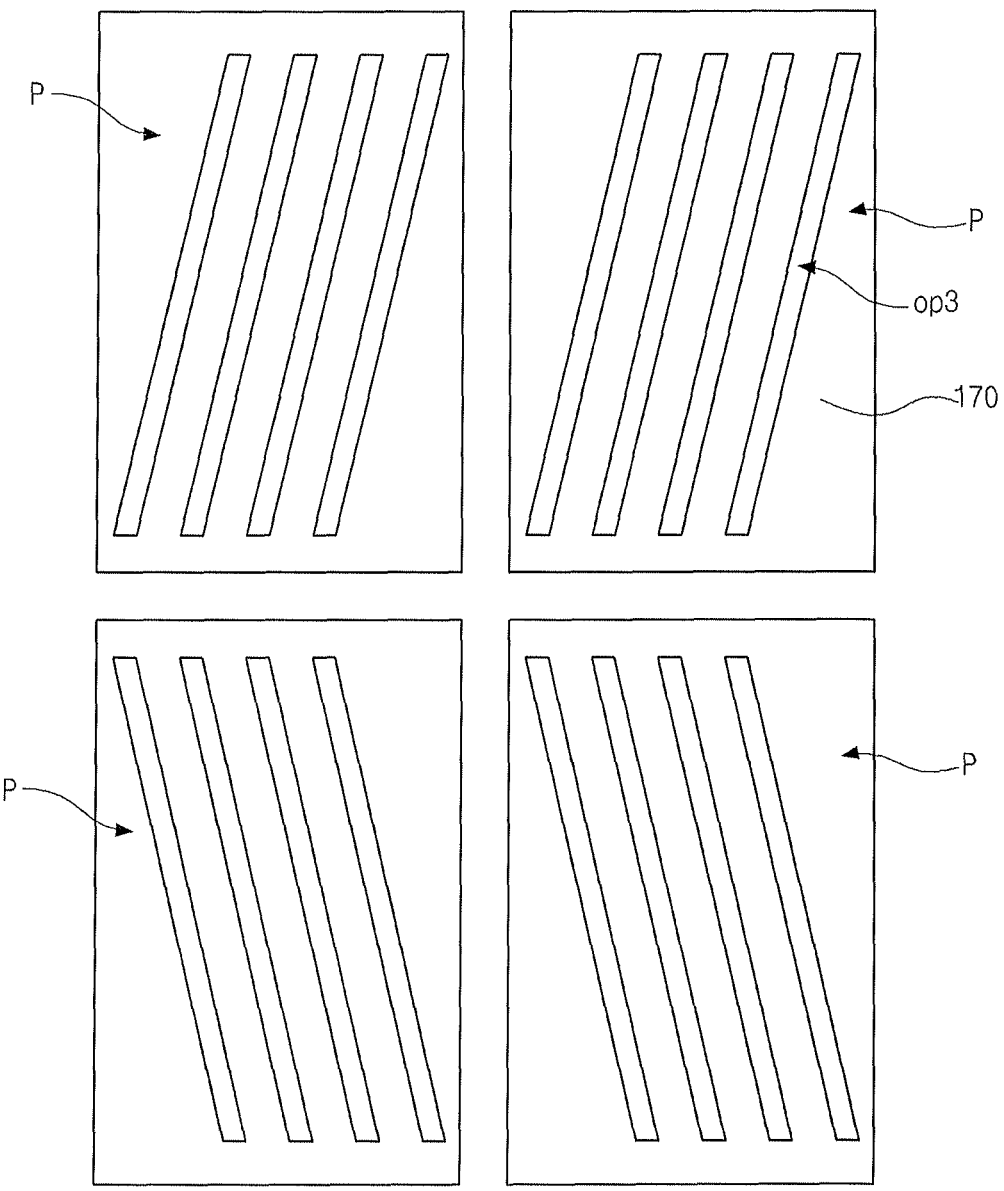
Figure 9:
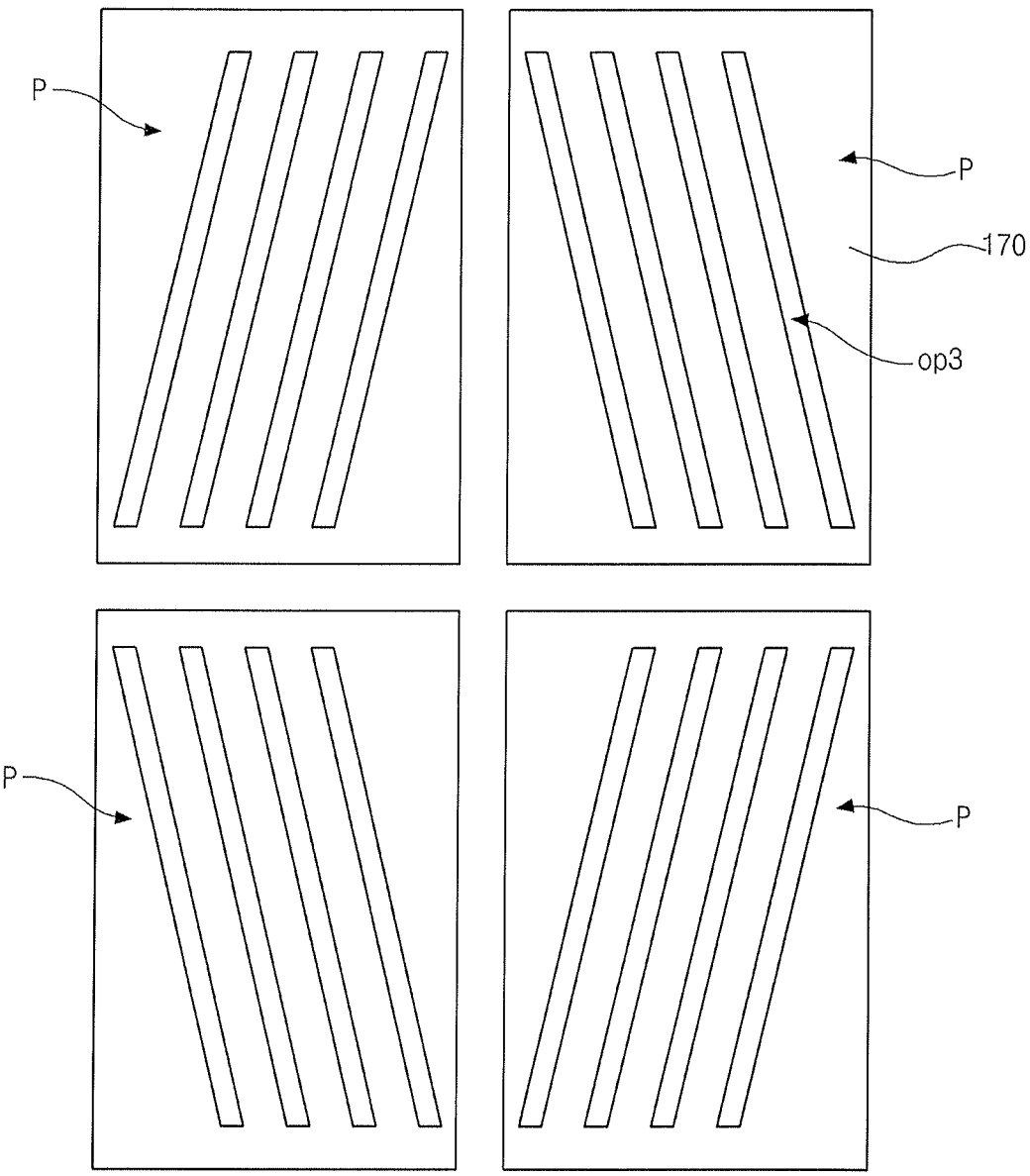

FIGS. 7 to 9 respectively show exemplary shapes of the third openings "op3". Referring to FIG. 7, the third openings "op3" of the pixel electrode 170 in one pixel region P has a bent shape such that two domains are generated in each pixel region P. Referring to FIG. 8, the third openings "op3" of the pixel electrode 170 in two vertically adjacent pixel regions P form a symmetrically bent shape with respect to the gate line 103 (of FIG. 4) between the two vertically adjacent pixel regions P, and such that different domains are generated in adjacent pixel regions P. Referring to FIG. 9, the third openings "op3" of four pixel electrodes 170 in adjacent pixel regions P arranged in a matrix shape, and have a symmetrically bent shape with respect to the gate line 103 (of FIG. 4) and the data line 130 (of FIG. 4) such that different domains are generated in the adjacent pixel regions P in FIG. 9.

Referring again to FIGS. 4 to 6, a connection pattern 175, which may be formed of the same material as the pixel electrode 170, is formed on the third passivation layer 163. One portion of the connection pattern 175 contacts the common electrode 160 in the first common contact hole 167, and another portion of the connection pattern 175 contacts the common line 107 in the second common contact hole 169. Namely, the common electrode 160 and the common line 107 are electrically connected to each other by the connection pattern 175.

As described in greater detail below, the above array substrate for the FFS mode LCD device can be fabricated by a six mask process. As a result, in comparison to the array substrate for the related art FFS mode LCD device, which is fabricated by a seven mask process, the array substrate for the FFS mode LCD device of the present invention has advantages in production costs and a fabricating process.

In addition, since a single common line 107 is formed at a center of the display region with no common line in other regions, the aperture ratio is improved. Moreover, since the common line 107 is positioned at a place of the gate line, the aperture ratio is further improved.

With FIGS. 10A to 10F, which are cross-sectional views showing a fabricating process of a part taken along the line V-V of FIG. 4, and FIGS. 11A to 11F, which are cross-sectional views showing a fabricating process of a part taken along the line VI-VI of FIG. 4, an exemplary six mask fabricating process will be explained.

Figure 10A:
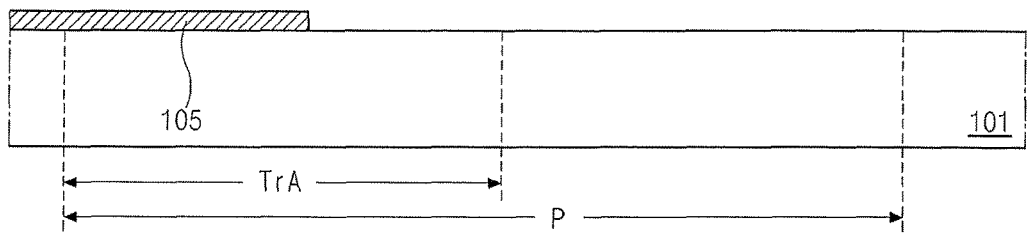
FIGS. 10A to 10F are cross-sectional views showing a fabricating process of a part taken along the line V-V of FIG. 4.
Figure 11A:
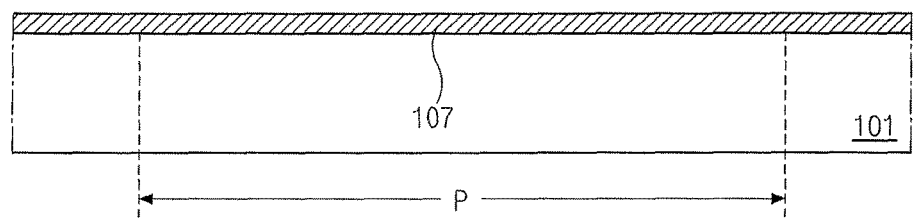
FIGS. 11A to 11F are cross-sectional views showing a fabricating process of a part taken along the line VI-VI of FIG. 4.

As shown in FIGS. 10A and 11A, a low resistance metallic material is deposited on the substrate 101 to form a first metal layer (not shown). For example, the low metallic material may include at least one of aluminum (Al), Al alloy, copper (Cu), Cu alloy, molybdenum (Mo) and Mo alloy (MoTi). Then, the first metal layer is patterned by a mask process, which includes a step of coating a photoresist (PR) layer on the first metal layer, a step of exposing the PR layer using an exposing mask, a step of developing the exposed PR layer to form a PR pattern, a step of etching the first metal layer using the PR pattern as an etching mask, and a step of stripping the PR pattern, to form the gate line 103 (of FIG. 4), the gate electrodes 105, which is connected to respective gate line 103, and the common line 107.

As explained above, the common line 107 and the gate lines 103 extend along the first direction and are spaced apart from each other. The common line 107 is formed only at the center of the display region, e.g., at the center of the display portion of a liquid crystal panel of LCD device. In alternative embodiments, the common line 107 may be formed only at another portion or location of the display region.

Figure 10B:
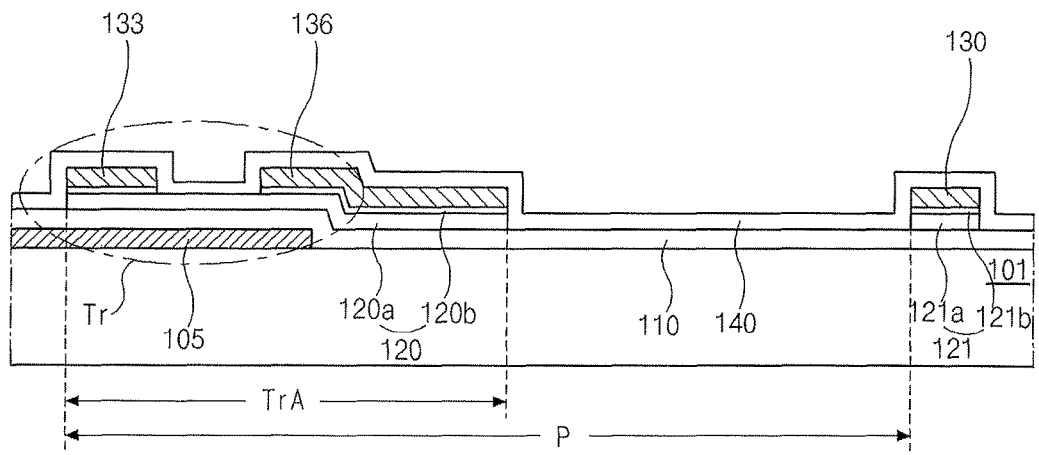
Figure 11B:
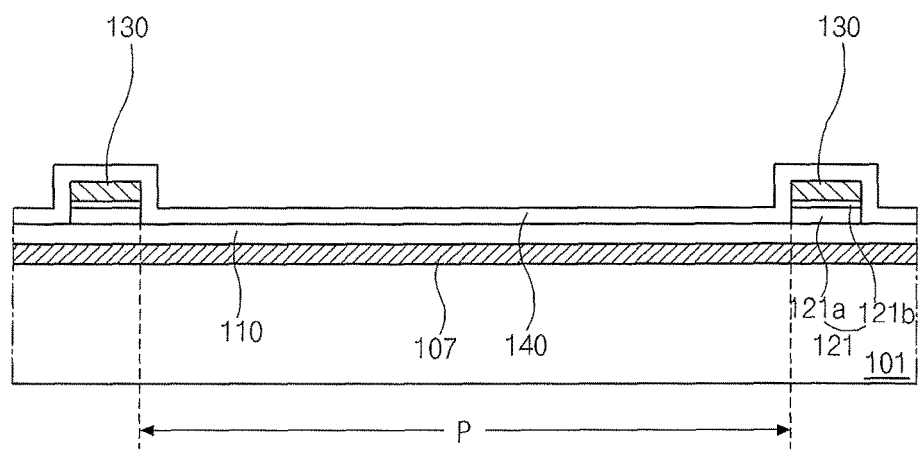

Next, a shown in FIGS. 10B and 11B, an inorganic insulating material, e.g., silicon oxide or silicon nitride, is deposited over the substrate 101, where the gate lines 103, the gate electrode 105 and the common line 107 are formed, to form the gate insulating layer 110.

Next, an intrinsic amorphous silicon layer (not shown), an impurity-doped amorphous silicon layer (not shown), and a second metal layer (not shown) are sequentially formed on the gate insulating layer 110. The intrinsic amorphous silicon layer, the impurity-doped amorphous silicon layer, and the second metal layer are patterned by a single mask process using a diffractive exposing method or a half-tone exposing method to form the active layer 120a of intrinsic amorphous silicon, the ohmic contact layer 120b of impurity-doped amorphous silicon, the source electrode 133 and the drain electrode 136 in the switching region TrA. The source and drain electrodes 133 and 136 are formed from the second metal layer and spaced apart from each other.

The gate electrode 105, the gate insulating layer 110, the semiconductor layer 120 including the active layer 120a and the ohmic contact layer 120b, the source electrode 133 and the drain electrode 136 constitute the TFT Tr in the switching region TrA.

During this process, the data line 130 is formed over the gate insulating layer 110. The data line 130 extends along the second direction to cross the gate lines 103 and the common line 107. As a result, the pixel regions P are defined.

In this instance, since the data line 130, the source and drain electrodes 133 and 136 and the semiconductor layer 120 are formed by a single mask process, a semiconductor dummy pattern 121 including first and second dummy patterns 121a and 121b are formed under the data line 130 and on the gate insulating layer 110.

Next, the first passivation layer 140 is formed over the substrate 101, where the TFT Tr and the data line 130 are formed, is formed by depositing an inorganic insulating material, e.g., silicon oxide or silicon nitride.

Figure 10C:
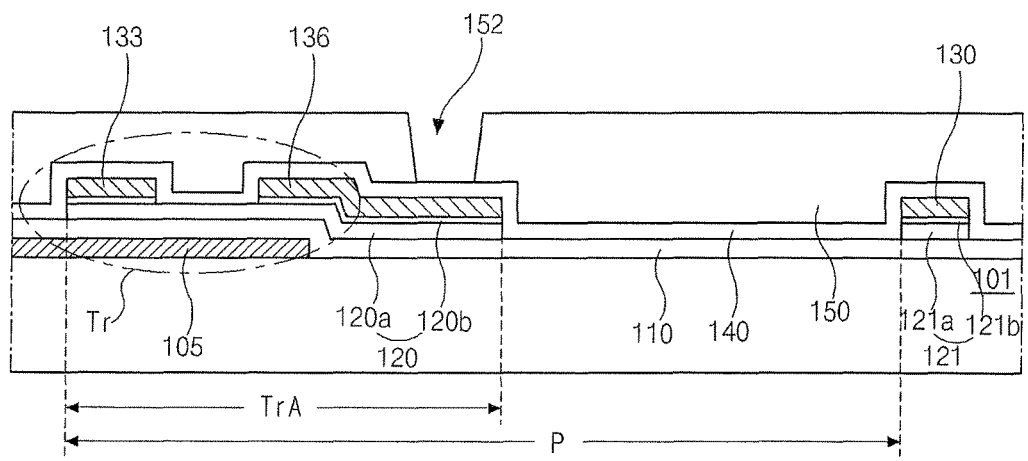
Figure 11C:
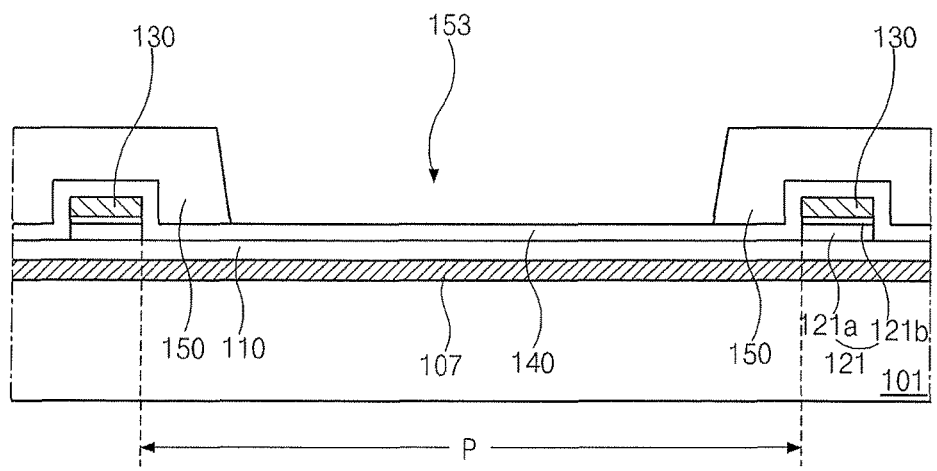

Next, as shown in FIGS. 10C and 11C, the second passivation layer 150 may be formed on the first passivation layer 140 by coating an organic insulating material having a low dielectric constant. For example, the second passivation layer 150 may be formed of photoacryl and have a thickness of about 1 to 3 micrometers to form a flat top surface.

When the second passivation layer 150 of the organic insulating material is directly formed on the TFT Tr without the first passivation layer of the inorganic insulating material, the active layer 120a is damaged or contaminated because the active layer 120a contacts the second passivation layer 150. In addition, when the second passivation layer 150 is patterned, the drain electrode 136 is contaminated by the organic insulating material of the second passivation layer 150 such that a contact problem between the drain electrode 136 and the pixel electrode 170 may be generated. To avoid these problems, the first passivation layer 140 is formed under the second passivation layer 150 without exposing the drain electrode 136, e.g., without performing a mask process to expose the drain electrode 136 after forming the first passivation layer 140 and before forming the second passivation layer 150.

Next, a mask process is performed to form the first hole 153 exposing the first passivation layer 140 and corresponding to the common line 107 and a second hole 152 exposing the first passivation layer 140 and corresponding to the drain electrode 136. The first hole 153 may be formed in each pixel region P or may be formed in at least two pixel regions P.

In this instance, the mask process for forming the first and second holes 153 and 152 is simple in comparison to that in other processes. Because the photoacryl has a photosensitive property, a photoresist pattern is not required. The second passivation layer 150 may be directly exposed using an exposing mask and is developed to form the first and second holes 153 and 152.

Figure 10D:
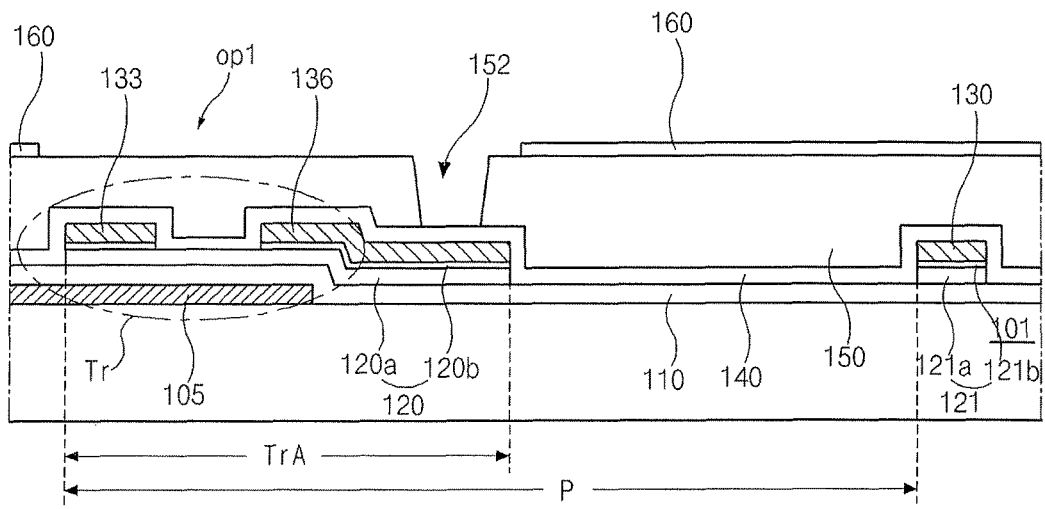
Figure 11D:
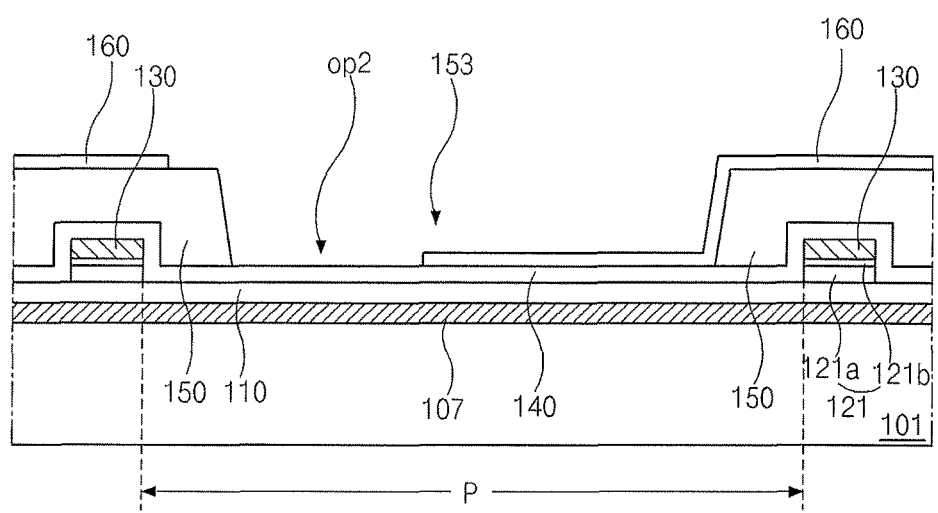

Next, as shown in FIGS. 10D and 11D, a transparent conductive material, e.g., ITO or IZO, is deposited on the second passivation layer 150, which includes the first and second holes 153 and 152, to form a first transparent conductive material layer (not shown). The first transparent conductive material layer is patterned by a mask process to form the common electrode 160 over an entire of the display region. The common electrode 160 includes the first opening "op1" corresponding to the switching region TrA and the second opening "op2" in the first hole 153.

Figure 10E:
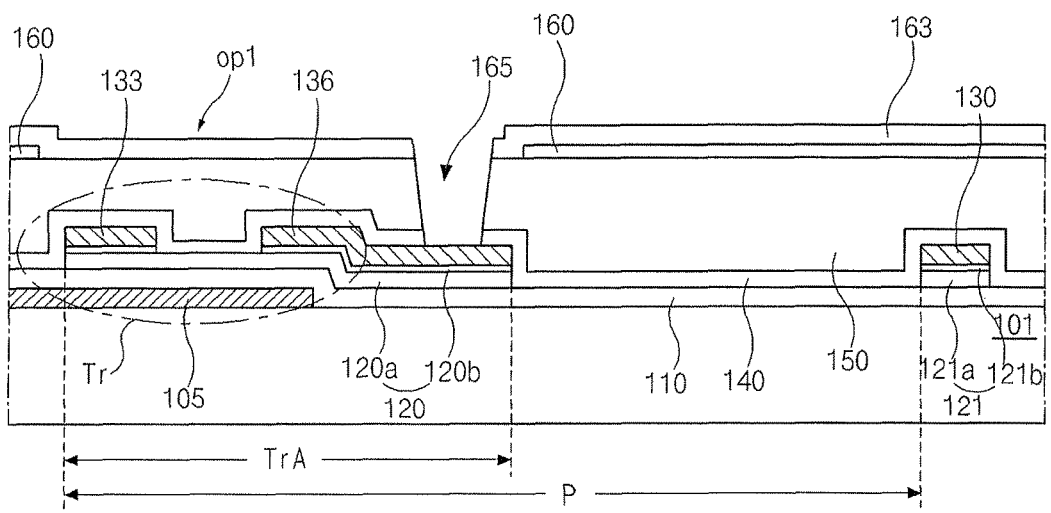
Figure 11E:
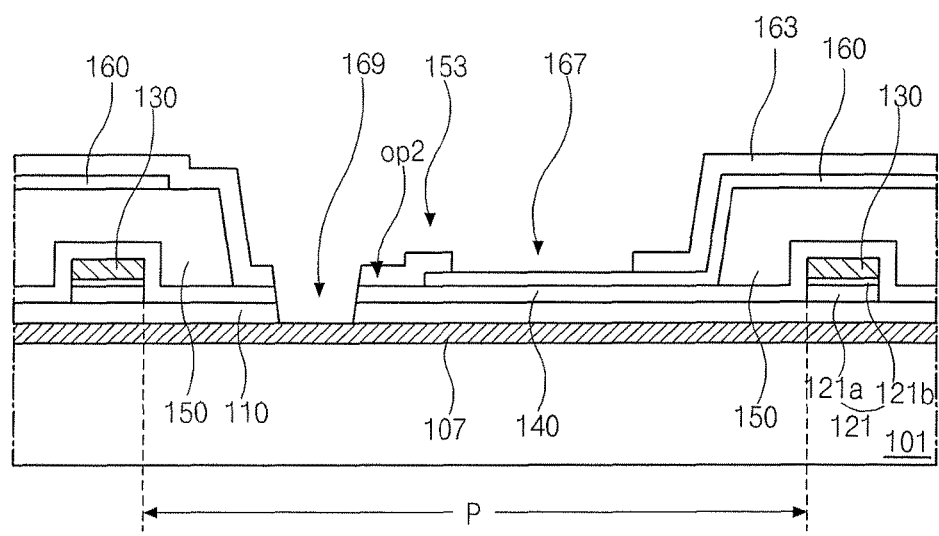

Next, as shown in FIGS. 10E and 11E, an inorganic insulating material, e.g., silicon oxide or silicon nitride, is deposited on the common electrode 160 to form the third passivation layer 163. The third passivation layer 163 is patterned by a mask process to form the first common contact hole 167, the second common contact hole 169 and the drain contact hole 165.

In more detail, the portion of the third passivation layer 163 corresponding to the first hole 153 is etched such that the common electrode 160 in the first hole 153 is exposed through the first common contact hole 167. The portions of the third passivation layer 163 and the first passivation layer 140 corresponding to the second hole 152 are etched such that the drain electrode 136 is exposed through the drain contact hole 165. The portions of the third passivation layer 163, the first passivation layer 140 and the gate insulating layer 110 corresponding to the second opening "op2" are etched such that the common line 107 is exposed through the second common contact hole 169.

Figure 10F:
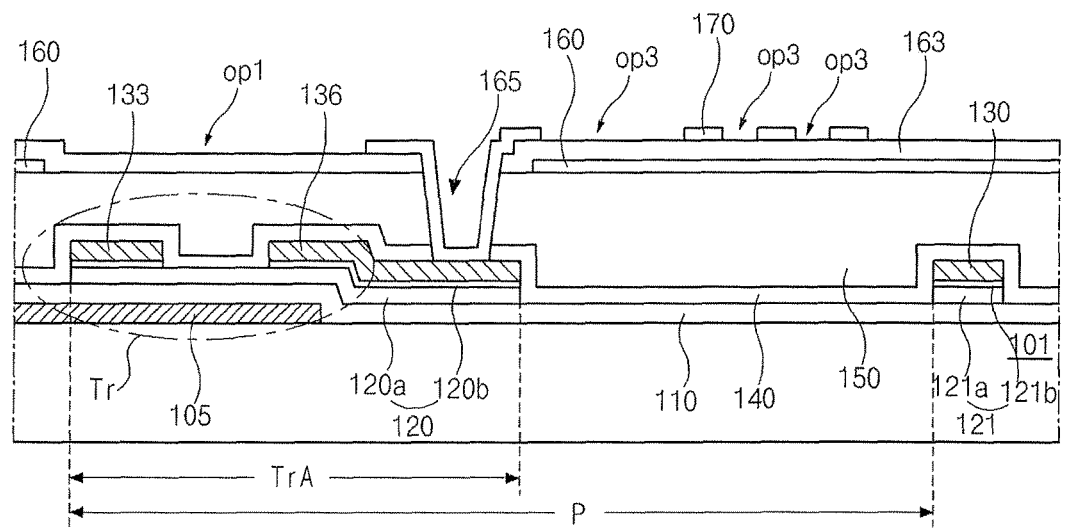
Figure 11F:
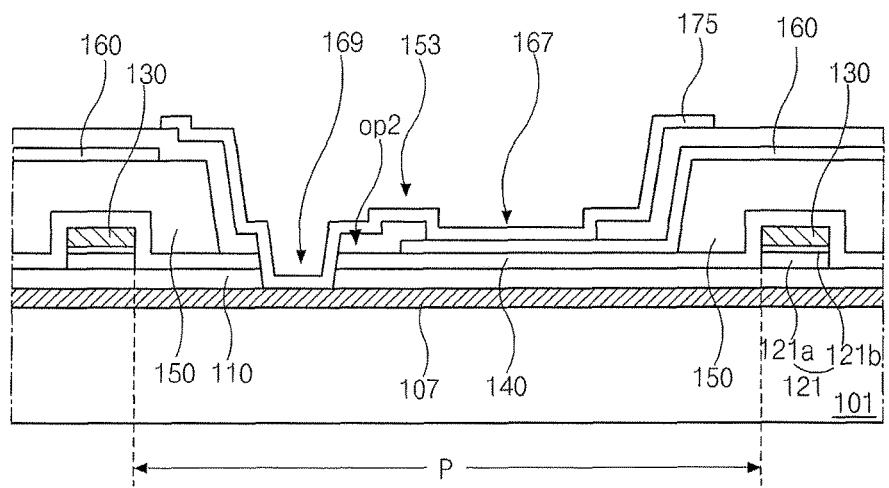

Next, as shown in FIGS. 10F and 11F, a transparent conductive material, e.g., ITO or IZO, is deposited on the third passivation layer 163 including the first and second common contact holes 167 and 169 and the drain contact hole 165 to form a second transparent conductive material layer (not shown). The second transparent conductive material layer is patterned by a mask process to form the pixel electrode 170 and the connection pattern 175.

The pixel electrode 170 has a plate shape in each pixel region P and contacts the drain electrode 136 through the drain contact hole 165. The pixel electrode 170 includes at least one third opening "op3" of a bar shape in a pixel region P. A shape of the third opening "op3" can vary, e.g., as explained with respect to FIGS. 7 to 9.

The connection pattern 175 contacts the common electrode 160 and the common line 107 through the first and second common contact holes 167 and 169, respectively, such that the common electrode 160 and the common line 107 are electrically connected to each other by the connection pattern 175. In other words, one end of the connection pattern 175 contacts the common electrode 160 in the first common contact hole 167, and the other end of the connection pattern 175 contacts the common line 197 in the second common contact hole 169.

The above array substrate for the FFS mode LCD device is fabricated by a six mask process. As a result, in comparison to the array substrate for the related art FFS mode LCD device, which is fabricated by a seven mask process, the array substrate for the FFS mode LCD device of the present invention has advantages in production costs and yield and a fabricating process because the array substrate is fabricated without one mask process.

In addition, since a single common line is formed at a center of the display region with no common line in other regions, the aperture ratio is improved. Moreover, since the common line is not across the pixel region, the aperture ratio is further improved.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An array substrate for a fringe field switching mode liquid crystal display (LCD) device, comprising:
    a common line on a substrate including a display region;
    a plurality of adjacent first gate lines disposed on an opposite side of the common line from a plurality of adjacent second gate lines;
    a gate insulating layer deposited on the plurality of adjacent first gate lines, on the plurality of adjacent second gate lines and on the common line;
    first and second data lines on the gate insulating layer, the first and second data lines crossing one of the plurality of adjacent first gate lines and the common line to define a first pixel region and crossing one of the plurality of adjacent second gate lines and the common line to define a second pixel region, each of the first and the second pixel regions having a pixel electrode;
    first and second thin film transistor (TFT) in each of the first and second pixel regions;
    a first passivation layer on the first and second data lines and the first and second TFTs;
    a second passivation layer on the first passivation layer and including first and second holes respectively corresponding to a drain electrode of the first and second TFTs and the common line;
    a common electrode on the second passivation layer and including a first opening corresponding to each of the first and second TFTs and a second opening in the second hole;
    a third passivation layer on the common electrode;
    a drain contact hole corresponding to the first hole and through the third and first passivation layers such that the drain electrode of the first and second TFTs is exposed through the drain contact hole;
    a first common contact hole corresponding to the second hole and through the third passivation layer such that the common electrode in the second hole is exposed through the first common contact hole;
    a second common contact hole corresponding to the second opening and through the third and first passivation layers and the gate insulating layer such that the common line is exposed through the second common contact hole;
    a pixel electrode on the third passivation layer and in each of the first and second pixel regions, the pixel electrode including at least one third opening and connected to respective drain electrode; and
    a connection pattern on the third passivation layer and connecting the common electrode to the common line,
    wherein the pixel electrode in the first pixel region is positioned between the common line and the one of the plurality of adjacent first gate lines, and the pixel electrode in the second pixel region is positioned between the common line and the one of the plurality of adjacent first gate lines,
    wherein the common line is positioned between one of the plurality of adjacent first gate lines and one of the plurality of adjacent second gate lines, and the plurality of adjacent first gate lines are separated from each other by the first pixel region and the plurality of adjacent second gate lines are separated from each other by the second pixel region.

2. The substrate according to claim 1, wherein one end of the connection pattern contacts the common electrode in the first common contact hole, and the other end of the connection pattern contacts the common line in the second common contact hole.

3. The substrate according to claim 1, wherein the gate insulating layer, the first passivation layer, and the third passivation layer are formed of one of silicon oxide or silicon nitride, and the second passivation layer is formed of photoacryl.

4. The substrate according to claim 1, wherein the first TFT is connected to the first gate line and the first data line, and the second TFT is connected to the second gate line and the second data line.

5. The substrate according to claim 1, wherein the third opening has a bent shape in each of the first and second pixel regions, or a bent shape with respect to the common line.

6. An array substrate for a fringe field switching mode liquid crystal display (LCD) device, comprising:
    a common line on a substrate including a display region;
    first croup of gate lines and second croup of gate lines at opposite sides of the common line;
    a gate insulating layer on the first and second gate lines and the common line;
    first and second data lines on the gate insulating layer, the first and second data lines crossing the first and second gate lines and the common line to define first and second pixel regions, respectively;
    first and second thin film transistor (TFT) in each of the first and second pixel regions;
    a first passivation layer on the first and second data lines and the first and second TFTs;
    a common electrode on the first passivation layer;
    a second passivation layer on the common electrode;
    a first common contact hole through the second passivation layer to expose a portion of the common electrode;
    a second common contact hole through the gate insulating layer and the first and second passivation layers to expose a portion of the common line;
    a pixel electrode on the second passivation layer and in each of the first and second pixel regions, the pixel electrode including at least one first opening and connected to an electrode of respective TFT; and
    a connection pattern contacting the portion of the common electrode through the first common contact hole and the portion of the common line through the second common contact hole,
    wherein the first common contact hole and the second common contact hole are arranged along an extension direction of the common line, and
    wherein the common line is positioned at a center of the display region, and
    wherein the common line is positioned between one of the plurality of adjacent first gate lines and one of the plurality of adjacent second gate lines, and the plurality of adjacent first gate lines are separated from each other by the first pixel region and the plurality of adjacent second gate lines are separated from each other by the second pixel region.

7. The substrate according to claim 6, further comprising a third passivation layer positioned between the first passivation layer and the common electrode and including a second opening corresponding to the first and second common contact holes.

8. The substrate according to claim 7, wherein a size of the second opening is larger than a size summation of the first and second common contact holes.

9. The substrate according to claim 7, wherein the common electrode in the second opening contacts an upper surface of the first passivation layer.

10. The substrate according to claim 7, wherein the second passivation layer in the second opening contacts an upper surface of the first passivation layer.

11. The substrate according to claim 6, wherein the first TFT is connected to the first gate line and the first data line, and the second TFT is connected to the second gate line and the second data line.

12. The substrate according to claim 6, wherein the first opening has a bent shape in each of the first and second pixel regions, or a bent shape with respect to the common line.

13. The substrate according to claim 6, wherein adjacent first gate lines of the group of first gate lines are separated by a pixel region of the first pixel regions and adjacent gate lines of the group of second gate lines are separated by a pixel region of the second pixel regions.

\* \* \* \* \*

UNITED STATES PATENT AND TRADEMARK OFFICE
CERTIFICATE OF CORRECTION

| | | |
|---|---|---|
| PATENT NO. | : 9,768,275 B2 | Page 1 of 1 |
| APPLICATION NO. | : 14/059138 | |
| DATED | : September 19, 2017 | |
| INVENTOR(S) | : Yeong-Hyeok Yun et al. | |

It is certified that error appears in the above-identified patent and that said Letters Patent is hereby corrected as shown below:

In the Claims

Column 12, Line 32 Claim 6:
"first croup of gate lines and second croup of gate lines at" should read, --first group of gate lines and second group of gate lines at--.

Signed and Sealed this
Fourteenth Day of August, 2018

Andrei Iancu
*Director of the United States Patent and Trademark Office*